US012792892B2

(12) United States Patent
Si et al.

(10) Patent No.: US 12,792,892 B2
(45) Date of Patent: Nov. 10, 2026

(54) METHOD, APPARATUS, AND DEVICE FOR OBTAINING ARTIFICIAL INTELLIGENCE MODEL, AND STORAGE MEDIUM

(71) Applicant: HUAWEI TECHNOLOGIES CO., LTD., Shenzhen (CN)

(72) Inventors: Xiaoyun Si, Nanjing (CN); Xinyu Hu, Nanjing (CN); Li Xue, Nanjing (CN); Liang Zhang, Nanjing (CN); Fuxing Chen, Boulogne Billancourt (FR)

(73) Assignee: Huawei Technologies Co., Ltd., Shenzhen (CN)

(*) Notice: Subject to any disclaimer, the term of this patent is extended or adjusted under 35 U.S.C. 154(b) by 915 days.

(21) Appl. No.: 17/957,889

(22) Filed: Sep. 30, 2022

(65) Prior Publication Data

US 2023/0031387 A1 Feb. 2, 2023

Related U.S. Application Data

(63) Continuation of application No. PCT/CN2020/142061, filed on Dec. 31, 2020.

(30) Foreign Application Priority Data

Mar. 31, 2020 (CN) ......................... 202010246686.8

(51) Int. Cl.
*G06N 3/063* (2023.01)
*G06N 3/08* (2023.01)
*G11C 11/54* (2006.01)

(52) U.S. Cl.
CPC ............... *G06N 3/063* (2013.01); *G06N 3/08* (2013.01); *G11C 11/54* (2013.01)

(58) Field of Classification Search
CPC ............................... G06N 20/00; G06N 3/098
See application file for complete search history.

(56) References Cited

U.S. PATENT DOCUMENTS 5,274,745 A * 12/1993 Suzuoka ................ G06N 3/048
706/26
2017/0116520 A1 4/2017 Min et al.
(Continued)

FOREIGN PATENT DOCUMENTS

EP 0410805 A2 1/1991

OTHER PUBLICATIONS

Shao R, Liu H, Liu D. Privacy preserving stochastic channel-based federated learning with neural network pruning. arXiv preprint arXiv:1910.02115. Oct. 4, 2019 (Year: 2019).*

(Continued)

*Primary Examiner* — Schyler S Sanks
(74) *Attorney, Agent, or Firm* — Leydig, Voit & Mayer, Ltd.

(57) ABSTRACT

A method, an apparatus, and a device for obtaining an artificial intelligence model, and a storage medium are provided. A client receives a first artificial intelligence (AI) model sent by a service end. The first AI model includes a plurality of neurons. The client determines, from the plurality of neurons, a target neuron participating in a current round of training, where the current round of training is a non-first round of training, and a quantity of target neurons is less than a total quantity of the plurality of neurons. The client trains the target neuron based on local data. The client returns parameter data corresponding to the target neuron to the service end. The parameter data corresponding to the target neuron is used by the service end to obtain a converged target AI model.

20 Claims, 5 Drawing Sheets

(56) References Cited

U.S. PATENT DOCUMENTS

| | | | | |
|---|---|---|---|---|
| 2018/0293488 | A1* | 10/2018 | Dang | G06N 3/088 |
| 2019/0311298 | A1 | 10/2019 | Kopp et al. | |

OTHER PUBLICATIONS

Shao et al., "Privacy Preserving Stochastic Channel-Based Federated Learning with Neural Network Pruning," arXiv:1910.02115v1, Cornell University Library, Internet: URL: https://arxiv.org/abs/1910.02115v1>, Total 12 pages (Oct. 2019).
Caldas et al., "Expanding the Reach of Federated Learning by Reducing Client Resource Requirements," XP055776744, Retrieved from the Internet: URL:https://arxiv.org/pdf/1812.07210.pdf [retrieved on Feb. 16, 2021], Total 12 pages (Jan. 8, 2019).
"General Data Protection Regulation," https://gdpr-info.eu/, Total 7 pages (May 2018).
Konecny et al., "Federated Learning: Strategies for Improving Communication Efficiency," arXiv:1610.05492v2 [cs.LG], Total 10 pages (Oct. 30, 2017).
Shao et al., "Medical Data Privacy Preserving: Stochastic Channel-Based Federated Learning with Neural Network Pruning," JMIR Formative Research, XP093288400, total 33 pages (Nov. 2019).

* cited by examiner

METHOD, APPARATUS, AND DEVICE FOR OBTAINING ARTIFICIAL INTELLIGENCE MODEL, AND STORAGE MEDIUM

CROSS-REFERENCE TO RELATED APPLICATIONS

This application is a continuation of International Application No. PCT/CN2020/142061, filed on Dec. 31, 2020, which claims priority to Chinese Patent Application No. 202010246686.8, filed on Mar. 31, 2020. The disclosures of the aforementioned applications are hereby incorporated by reference in their entireties.

TECHNICAL FIELD

Embodiments of this application relate to the field of artificial intelligence technologies, and in particular, to a method, an apparatus, and a device for obtaining an artificial intelligence model, and a storage medium.

BACKGROUND

With development of artificial intelligence technologies, there are more artificial intelligence (AI) models, and more manners for obtaining an artificial intelligence model, such as a federated learning (FL) manner for obtaining an artificial intelligence model.

Federated learning is an emerging basic artificial intelligence technology, is originally used to resolve a problem that a user of an Android mobile phone terminal updates a model locally, and aims to implement efficient machine learning among a plurality of participants or computing nodes on the premise of protecting terminal data and personal data privacy and ensuring legal compliance. Currently, the federated learning is expanded to jointly build an AI model without data sharing, to improve AI model effects.

SUMMARY

Embodiments of this application provide a method, an apparatus, and a device for obtaining an artificial intelligence model, and a storage medium, to resolve a problem in a related technology. Technical solutions are as follows.

According to a first aspect, a method for obtaining an artificial intelligence model is provided. That a client performs the method is used as an example. The method includes: The client receives a first artificial intelligence AI model sent by a service end, where the first AI model includes a plurality of neurons; the client determines, from the plurality of neurons, a target neuron participating in a current round of training, where the current round of training is a non-first round of training, and a quantity of target neurons is less than a total quantity of the plurality of neurons; the client trains the target neuron based on local data; and the client returns parameter data corresponding to the target neuron to the service end, where the parameter data corresponding to the target neuron is used by the service end to obtain a converged target AI model.

According to the method provided in this embodiment of this application, not all neurons in the model need to be trained, but some neurons are selected for training based on an active condition. This can reduce power consumption, and increase a training speed. In addition, because the client transmits only a parameter corresponding to a trained neuron to the service end, communication bandwidth can be reduced.

In an example embodiment, the target neuron is a neuron whose activity degree meets a condition. For example, an activity degree of the target neuron is greater than an activity degree threshold.

In an example embodiment, each neuron in the plurality of neurons has a corresponding frozen-active flag bit, and when a value of the frozen-active flag bit is a first value, the frozen-active flag bit indicates that the neuron participates in the current round of training. The determining, from the plurality of neurons, a target neuron participating in a current round of training includes determining the neuron whose value of frozen-active flag bit is the first value as the target neuron participating in the current round of training.

A frozen-active flag bit indicates an active condition, so that a target neuron can be directly determined by using the frozen-active flag bit. Therefore, a speed of determining the target neuron is relatively high. This further reduces training time and increases the training speed.

In an example embodiment, each neuron in the plurality of neurons has a corresponding frozen period, and the frozen period indicates a period in which the neuron does not participate in training; and a value of a frozen-active flag bit corresponding to any neuron is determined based on a frozen period corresponding to the any neuron.

In an example embodiment, before the determining the neuron whose value of frozen-active flag bit is the first value as the target neuron participating in the current round of training, the method further includes: for the any neuron in the plurality of neurons, obtaining an activity degree of the any neuron in a previous round of training, where the activity degree indicates a degree to which the neuron is affected by the local data; and updating the frozen period of the any neuron based on the activity degree of the any neuron in the previous round of training, and updating the value of the frozen-active flag bit of the any neuron based on an updated frozen period of the any neuron.

In an example embodiment, each neuron in the plurality of neurons further has a corresponding frozen period counter, and the frozen period counter indicates whether the frozen period ends; and the obtaining an activity degree of the any neuron in a previous round of training includes: in response to the fact that a value of a frozen period counter of the any neuron indicates that the frozen period of the any neuron ends, obtaining the activity degree of the any neuron in the previous round of training.

In an example embodiment, the determining, from the plurality of neurons, a target neuron participating in a current round of training includes:

for any neuron in the plurality of neurons, obtaining an activity degree of the any neuron in a previous round of training, where the activity degree indicates a degree to which the neuron is affected by the local data; and in response to the fact that the activity degree of the any neuron in the previous round of training is greater than an activity degree threshold, determining the any neuron as the target neuron participating in the current round of training.

In an example embodiment, the obtaining an activity degree of the any neuron in a previous round of training includes:

obtaining a first average value of parameters obtained before the previous round of training of the any neuron and a second average value of parameters obtained after the previous round of training of the any neuron;

obtaining a difference between the first average value and the second average value; and determining the activity degree of the any neuron in the previous round of training based on an absolute value of the difference and an absolute value of the first average value.

In an example embodiment, before the receiving a first artificial intelligence AI model sent by a service end, the method further includes:

receiving the first artificial intelligence AI model sent by the service end, determining all neurons in the plurality of neurons as target neurons, and training the target neurons based on the local data.

In an example embodiment, the returning parameter data corresponding to the target neuron to the service end further includes:

sending the frozen-active flag bit of each neuron to the service end, or sending, to the service end, a frozen-active flag bit whose value changes.

In an example embodiment, the returning parameter data corresponding to the target neuron to the service end includes: returning only the parameter data corresponding to the target neuron to the service end.

A method for obtaining an artificial intelligence model is provided. The method includes:

obtaining, by a service end, a to-be-trained first artificial intelligence AI model, where the first AI model includes a plurality of neurons;

sending, by the service end, the first AI model to a plurality of clients;

receiving, by the service end, parameter data that corresponds to a target neuron and that is returned by each client in the plurality of clients, where parameter data that corresponds to the target neuron and that is returned by any client is obtained by the any client by training the target neuron in the first AI model, and a quantity of target neurons is less than a total quantity of the plurality of neurons; and restoring, by the service end based on the parameter data that corresponds to the target neuron and that is returned by each client, a second AI model corresponding to each client, and obtaining a converged target AI model based on the second AI model corresponding to each client.

In an example embodiment, the restoring, based on the parameter data that corresponds to the target neuron and that is returned by each client, a second AI model corresponding to each client includes:

for the any client, updating, based on the parameter data that corresponds to the target neuron and that is returned by the any client, a parameter corresponding to the target neuron in the first AI model, to obtain a second AI model corresponding to the any client.

In an example embodiment, the obtaining a converged target AI model based on the second AI model corresponding to each client includes:

performing federated averaging on the second AI model corresponding to each client, to obtain a third AI model; and in response to the fact that the third AI model is converged, using the third AI model as the target AI model; or in response to the fact that the third AI model is not converged, sending the third AI model to the plurality of clients, continuing to obtain a new AI model in a manner of obtaining the third AI model, and repeating this process until the converged target AI model is obtained.

In an example embodiment, before the restoring, based on the parameter data that corresponds to the target neuron and that is returned by each client, a second AI model corresponding to each client, the method further includes:

receiving a frozen-active flag bit of each neuron or a frozen-active flag bit whose value changes, that is returned by the plurality of clients; and determining the target neuron in the plurality of neurons by using the frozen-active flag bit of each neuron or the frozen-active flag bit whose value changes.

An apparatus for obtaining an artificial intelligence model is provided. The apparatus includes:

a communications unit, configured to receive a first artificial intelligence AI model sent by the service end, where the first AI model includes a plurality of neurons; and a processing unit, configured to determine, from the plurality of neurons, a target neuron participating in a current round of training, where the current round of training is a non-first round of training, and a quantity of target neurons is less than a total quantity of the plurality of neurons.

The processing unit is further configured to train the target neuron based on local data.

The communications unit is further configured to return parameter data corresponding to the target neuron to the service end. The parameter data corresponding to the target neuron is used by the service end to obtain a converged target AI model.

In an example embodiment, each neuron in the plurality of neurons has a corresponding frozen-active flag bit, and when a value of the frozen-active flag bit is a first value, the frozen-active flag bit indicates that the neuron participates in the current round of training.

The processing unit is configured to determine the neuron whose value of frozen-active flag bit is the first value as the target neuron participating in the current round of training.

In an example embodiment, each neuron in the plurality of neurons further has a corresponding frozen period, and the frozen period indicates a period in which the neuron does not participate in training.

A value of a frozen-active flag bit corresponding to any neuron is determined based on a frozen period corresponding to the any neuron.

In an example embodiment, the processing unit is further configured to: for the any neuron in the plurality of neurons, obtain an activity degree of the any neuron in a previous round of training, where the activity degree indicates a degree to which the neuron is affected by the local data; and update the frozen period of the any neuron based on the activity degree of the any neuron in the previous round of training, and update the value of the frozen-active flag bit of the any neuron based on an updated frozen period of the any neuron.

In an example embodiment, each neuron in the plurality of neurons further has a corresponding frozen period counter, and the frozen period counter indicates whether the frozen period ends.

The processing unit is configured to: in response to the fact that a value of a frozen period counter of the any neuron indicates that the frozen period of the any neuron ends, obtain the activity degree of the any neuron in the previous round of training.

In an example embodiment, the processing unit is configured to: in response to the fact that the current round of training is the non-first round of training, for any neuron in the plurality of neurons, obtain an activity degree of the any neuron in a previous round of training, where the activity degree indicates a degree to which the neuron is affected by the local data; and in response to the fact that the activity degree of the any neuron in the previous round of training is greater than an activity degree threshold, determine the any neuron as the target neuron participating in the current round of training.

In an example embodiment, the processing unit is configured to: obtain a first average value of parameters obtained before the previous round of training of the any neuron and a second average value of parameters obtained after the previous round of training of the any neuron; obtain a difference between the first average value and the second average value; and determine the activity degree of the any neuron in the previous round of training based on an absolute value of the difference and an absolute value of the first average value.

In an example embodiment, the processing unit is further configured to: receive the first artificial intelligence AI model sent by the service end, determine all neurons in the plurality of neurons as target neurons, and train the target neurons based on the local data.

In an example embodiment, the communications unit is further configured to send the frozen-active flag bit of each neuron to the service end, or send, to the service end, a frozen-active flag bit whose value changes.

In an example embodiment, the communications unit is configured to return only the parameter data corresponding to the target neuron to the service end.

An apparatus for obtaining an artificial intelligence model is further provided. The apparatus includes:

- a processing unit, configured to obtain a to-be-trained first artificial intelligence AI model, where the first AI model includes a plurality of neurons; and
- a communications unit, configured to send the first AI model to a plurality of clients.

The communications unit is further configured to receive parameter data that corresponds to a target neuron and that is returned by each client in the plurality of clients. Parameter data that corresponds to the target neuron and that is returned by any client is obtained by the any client by training the target neuron in the first AI model, and a quantity of target neurons is less than a total quantity of the plurality of neurons.

The processing unit is further configured to: restore, based on the parameter data that corresponds to the target neuron and that is returned by each client, a second AI model corresponding to each client, and obtain a converged target AI model based on the second AI model corresponding to each client.

In an example embodiment, the processing unit is configured to: for any client, update, based on the parameter data that corresponds to the target neuron and that is returned by the any client, a parameter corresponding to the target neuron in the first AI model, and supplement a parameter corresponding to a non-target neuron in the first AI model, to obtain a second AI model corresponding to the any client.

In an example embodiment, the processing unit is configured to: perform federated averaging on the second AI model corresponding to each client, to obtain a third AI model; and in response to the fact that the third AI model is converged, use the third AI model as the target AI model; or in response to the fact that the third AI model is not converged, send the third AI model to the plurality of clients, continue to obtain a new AI model in a manner of obtaining the third AI model, and repeat this process until the converged target AI model is obtained.

In an example embodiment, the communications unit is further configured to receive a frozen-active flag bit of each neuron or a frozen-active flag bit whose value changes, that is returned by the plurality of clients.

The processing unit is configured to determine the target neuron in the plurality of neurons by using the frozen-active flag bit of each neuron or the frozen-active flag bit whose value changes.

A device for obtaining an artificial intelligence model is further provided. The device includes a memory and a processor. The memory stores at least one instruction, and the at least one instruction is loaded and executed by the processor, to implement the method for obtaining an artificial intelligence model according to any one of the first aspect and the example embodiments of the first aspect.

A device for obtaining an artificial intelligence model is further provided. The device includes a memory and a processor. The memory stores at least one instruction, and the at least one instruction is loaded and executed by the processor, to implement the method for obtaining an artificial intelligence model according to any one of the second aspect and the example embodiments of the second aspect.

A computer-readable storage medium is further provided. The storage medium stores at least one instruction, and the instruction is loaded and executed by a processor to implement any one of the foregoing methods for obtaining an artificial intelligence model.

Another communications apparatus is provided. The apparatus includes a transceiver, a memory, and a processor. The transceiver, the memory, and the processor communicate with each other through an internal connection channel. The memory is configured to store instructions. The processor is configured to execute the instructions stored in the memory, to control the transceiver to receive a signal, and control the transceiver to send a signal. In addition, when the processor executes the instructions stored in the memory, the processor is enabled to perform the method according to the first aspect and the possible implementations of the first aspect.

Another communications apparatus is provided. The apparatus includes a transceiver, a memory, and a processor. The transceiver, the memory, and the processor communicate with each other through an internal connection channel. The memory is configured to store instructions. The processor is configured to execute the instructions stored in the memory, to control the transceiver to receive a signal, and control the transceiver to send a signal. In addition, when the processor executes the instructions stored in the memory, the processor is enabled to perform the method according to the second aspect and the possible implementations of the second aspect.

In an example embodiment, there are one or more processors, and there are one or more memories.

In an example embodiment, the memory may be integrated with the processor, or the memory is disposed independently of the processor.

In a specific implementation process, the memory may be a non-transitory memory, such as a read-only memory (ROM). The memory and the processor may be integrated into one chip, or may be separately disposed in different chips. A type of the memory and a manner in which the memory and the processor are disposed are not limited in this embodiment of this application.

A computer program (product) is provided. The computer program (product) includes computer program code. When the computer program code is run on a computer, the computer is enabled to perform the methods according to the foregoing aspects.

A chip is provided. The chip includes a processor, configured to: invoke, from a memory, instructions stored in the memory and run the instructions, so that a communications device on which the chip is installed performs the methods according to the foregoing aspects.

Another chip is provided. The chip includes an input interface, an output interface, a processor, and a memory. The input interface, the output interface, the processor, and the memory are connected to each other through an internal connection channel. The processor is configured to execute code in the memory. When the code is executed, the processor is configured to perform the methods according to the foregoing aspects.

DESCRIPTION OF EMBODIMENTS

Terms used in an implementation part of this application are merely used to explain embodiments of this application, and are not intended to limit this application.

With the development of artificial intelligence technologies, there are more and more artificial intelligence models, and manners of obtaining the artificial intelligence models are also increasing, such as a federated learning manner for obtaining an AI model. Federated learning is an emerging basic artificial intelligence technology, is originally used to resolve a problem that a user of an Android mobile phone terminal updates a model locally, and aims to implement efficient machine learning among a plurality of participants or computing nodes on the premise of protecting terminal data and personal data privacy and ensuring legal compliance. Currently, the federated learning is expanded to jointly build an AI model without data sharing, to improve AI model effects.

Figure 1:
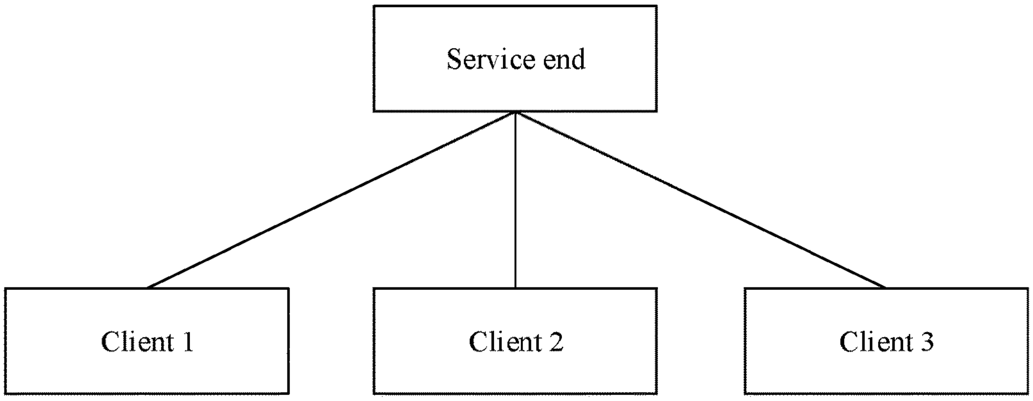
FIG. 1 is a schematic diagram of a network architecture for federated learning according to an embodiment of this application.

A network architecture for federated learning shown in FIG. 1 is used as an example. The network architecture is divided into two layers: A lower layer is a plurality of clients, and an upper layer is a service end. The client usually indicates a device, and a large amount of data flows into the device. As shown in FIG. 1, an example in which the plurality of clients included in the network architecture are a client 1, a client 2, and a client 3 is used. Usually, it is difficult to collect or share data of the clients. Therefore, an AI model trained based on data of the client 1 is valid only for the client 1, an AI model trained based on data of the client 2 is valid only for the client 2, and an AI model trained based on data of the client 3 is valid only for the client 3. To use data from all clients, a federated learning manner for obtaining an AI model emerges.

In a process of obtaining an AI model through federated learning, each client starts local training on an initial central model (generally the same) by using data of the current device (data of each client may be different). After local training is performed on each client for a plurality of batches, local models are uploaded to the service end. The service end performs aggregation and federated update on the local models to form an updated central model. If the updated central model is not converged, the service end continues to deliver the updated central model to each client. Each client continues local training on the updated central model by using the data of the current device, and then uploads the updated central model to the service end. This process repeats until a converged central model is obtained. In this case, federated training is completed.

The central model obtained through training in the foregoing federated learning manner has an excellent discrimination capability for data of all clients, which greatly meets a requirement that an AI model can be jointly built by collecting data of different clients.

However, in the foregoing process of training an AI model through federated learning, each client needs to perform complete training on a complete model delivered by the service end, and training time is relatively long. In addition, the complete model is transmitted between the client and the service end, resulting in relatively high communication overheads.

Therefore, an embodiment of this application provides a method for obtaining an AI model. In the method, when local training is performed on a client, only neurons that can be active by being affected by local data are trained, and inactive neurons are frozen. That inactive neurons are frozen indicates that the neurons do not participate in training. Because the client uploads only parameter data of an active target neuron each time, to transmit important information to the service end, even for a small-scale client, the service end does not lose converged important information. In addition, because only the non-frozen target neuron is trained during training, training time of the client is accelerated, and power consumption of the device is reduced.

Figure 2:
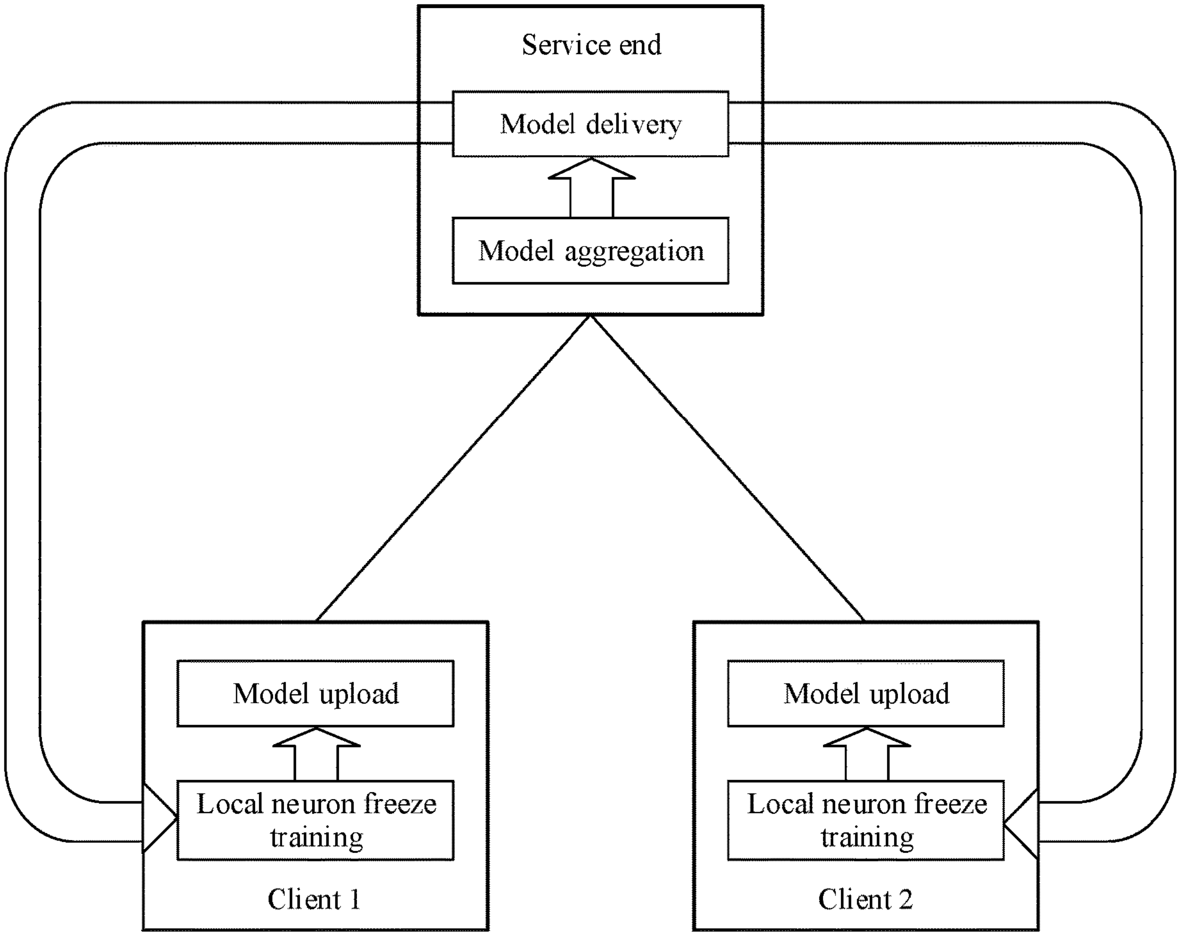
FIG. 2 is a schematic diagram of a network architecture for federated learning according to an embodiment of this application.

For example, the method provided in this embodiment of this application may be applied to a network architecture shown in FIG. 2. As shown in FIG. 2, the network architecture includes two clients: a client 1 and a client 2. The client 1 and the client 2 may be any device that supports local training, including but not limited to: a mobile phone, a tablet, a computer, a switch, an optical line terminal (OLT), an optical network terminal (ONT), a router, or the like. A service end may be any device or cloud platform that supports multi-model aggregation and federation, including but not limited to a server, a public cloud, or the like.

As shown in FIG. 2, each client performs a current round of model training by using local data, trains only a target neuron that participates in the current round of training, and uploads corresponding parameter data of the target neuron to the service end after the training ends. For example, to the service end, a local model is uploaded, or only a parameter corresponding to the target neuron that participates in the current round of training is uploaded, or a parameter corresponding to each neuron (including a parameter corresponding to the target neuron and a parameter corresponding to a non-target neuron) is uploaded, or only a parameter difference corresponding to the target neuron is uploaded. After aggregating parameter data that corresponds to the target neuron participating in training and that is returned by each client, the service end restores an AI model of each client, and obtains an updated central model based on the AI model. If the updated central model is not converged, the updated central model is delivered to each client. Each client starts a next round of training until a converged central model is obtained.

Figure 3:
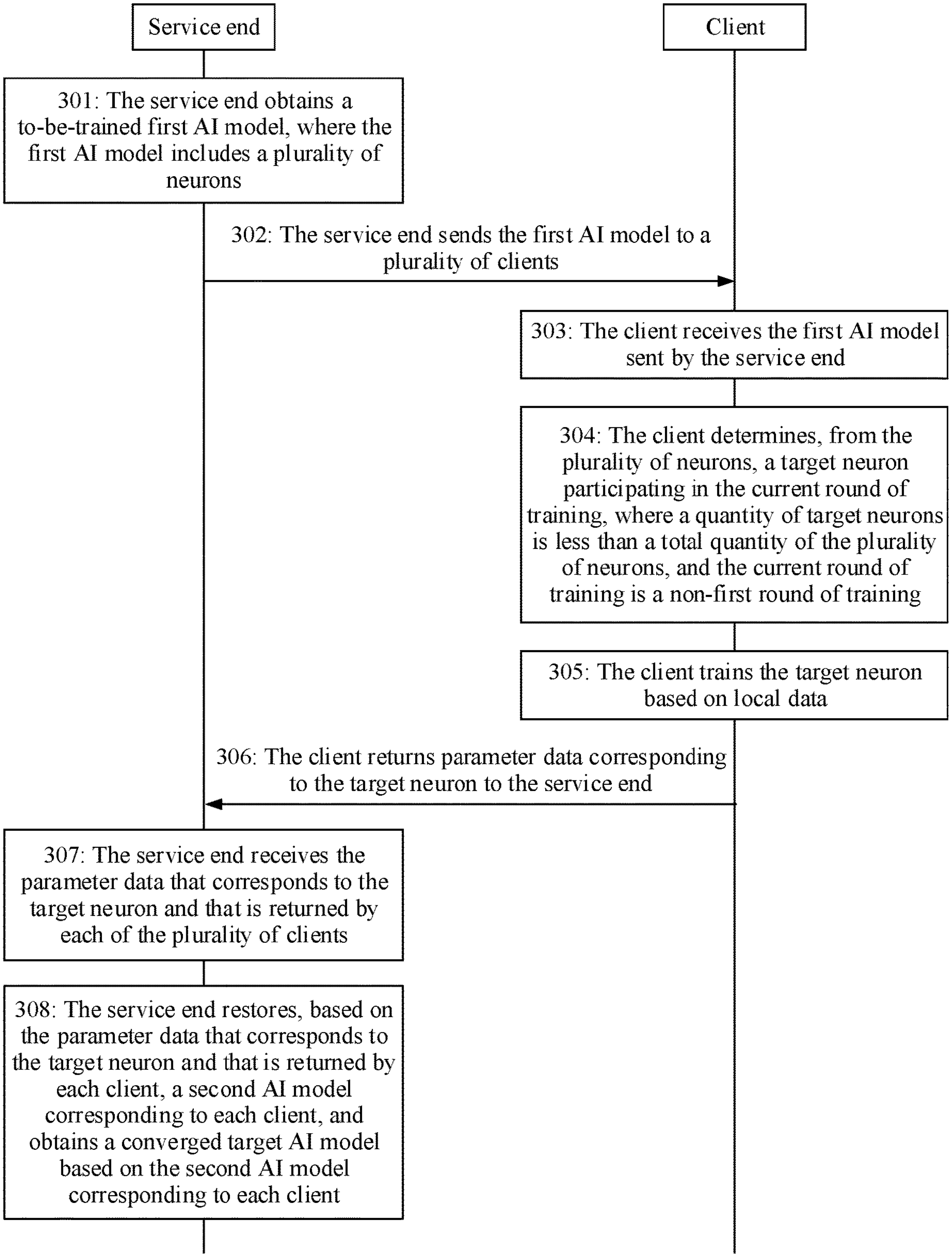
FIG. 3 is a flowchart of a method for obtaining an artificial intelligence model according to an embodiment of this application.

The following uses the network architecture shown in FIG. 2 as an example to describe the method for obtaining an artificial intelligence model provided in this embodiment of this application. As shown in FIG. 3, in the method, an AI model may be obtained through interaction between a service end and a client. The method provided in this embodiment of this application may include the following several processes.

301: The service end obtains a to-be-trained first AI model, where the first AI model includes a plurality of neurons.

The to-be-trained first AI model may be an initial AI model that is not trained, or may be an AI model that has undergone one or more rounds of training but has not converged and still needs to be retrained. Regardless of the initial AI model or the AI model that has not converged and needs to be retrained, the first AI model includes a plurality of neurons. A neuron is a basic unit of an AI model, mainly simulates a structure and characteristics of a biological neuron, receives a group of input signals, and generates output.

A quantity of neurons included in the first AI model is not limited in this embodiment of this application, and a type of the to-be-trained first AI model is not limited in this embodiment of this application. The first AI model may be any type of AI model. For example, when obtaining the to-be-trained first AI model, a server may determine, based on an application scenario, a type of the first AI model to be obtained.

302: The service end sends the first AI model to a plurality of clients.

In an implementation environment to which the method provided in this embodiment of this application is applied, as shown in FIG. 2, the service end is communicatively connected to the plurality of clients, and the plurality of clients may perform federated learning to obtain a final converged target AI model. Therefore, the service end obtains the first AI model, the service end may send the first AI model to the plurality of clients, and the plurality of clients separately perform a training process on the first AI model.

In an example embodiment, when sending the first AI model to the client, the service end may further send a quantity of training batches to the client, so that each client can determine a quantity of times of performing a current round of training on the first AI model. If a plurality of rounds of training are required, the service end may send a corresponding quantity of batches each time the service end sends the first AI model to the client, and quantities of batches for different rounds of training may be different or the same. If the quantities of batches for the rounds of training are the same, the service end may deliver the quantity of batches to the client in only a first round of training, and does not repeatedly send the quantity of batches subsequently. Furthermore, in addition to a manner in which the service end sends the quantity of training batches to the client, the service end may not deliver the quantity of training batches, but each round of training is performed based on a quantity of batches that is agreed on in advance.

303: The client receives the first AI model sent by the service end.

The client may be any one of the plurality of clients connected to the service end.

It should be noted that, in this embodiment of this application, only one of the plurality of clients connected to the service end is used as an example to describe an operation process of the client. The operation process of the client in this embodiment of this application is applicable to the plurality of clients connected to the service end, and operation processes of all the clients are not described one by one again.

304: The client determines, from the plurality of neurons, a target neuron participating in the current round of training. A quantity of target neurons is less than a total quantity of the plurality of neurons, and the current round of training is a non-first round of training.

Because local data has different degrees of impact on different neurons, parameters of some neurons may not change greatly after local data-based training. Therefore, in the method provided in this embodiment of this application, after receiving the to-be-trained first AI model, the client may not need to train all neurons in the first AI model, but train only a target neuron whose activity degree meets a specific condition. The target neuron whose activity degree meets the specific condition may be a neuron that can be active due to impact of the local data. A manner in which the client determines, from the plurality of neurons, the target neuron participating in the current round of training is not limited in this embodiment of this application. For example, the target neuron is a neuron whose activity degree meets a condition. For example, the activity degree is greater than an activity degree threshold.

For the first round of training, because the first AI model is not trained, which neurons are active and which neurons are inactive cannot be determined. Therefore, the determining, from the plurality of neurons, a target neuron participating in the current round of training includes: receiving the first artificial intelligence AI model sent by the service end, determining all of the plurality of neurons as target neurons, and training the target neurons based on the local data.

For a case in which the current round of training is the non-first round of training, only the following two manners are used as examples for description.

Manner 1: The target neuron participating in the current round of training is determined in the plurality of neurons based on an activity degree of the neuron.

For the case in which the current round of training is the non-first round of training, because the neurons are trained in a previous round of training by using the local data, which neurons are active and which neurons are inactive may be determined. Therefore, for the case in which the current round of training is the non-first round of training, the determining, from the plurality of neurons, a target neuron participating in the current round of training includes but is not limited to: for any neuron in the plurality of neurons, obtaining an activity degree of the any neuron in the previous round of training, where the activity degree indicates a degree to which the neuron is affected by the local data; and in response to the fact that the activity degree of the any neuron in the previous round of training is greater than the activity degree threshold, using the any neuron as the target neuron participating in the current round of training.

A manner of obtaining the activity degree of the any neuron in the previous round of training is not limited in this embodiment of this application. For example, the obtaining an activity degree of the any neuron in the previous round of training includes: obtaining a first average value of parameters obtained before the previous round of training of the any neuron and a second average value of parameters obtained after the previous round of training of the any neuron; obtaining a difference between the first average value and the second average value; and determining, based on an absolute value of the difference and an absolute value of the first average value, the activity degree of the any neuron in the previous round of training.

For example, the first average value of the parameters obtained before the previous round of training of the any neuron is AC, and the second average value of the parameters obtained after the previous round of training of the any neuron is AE. A quotient of the absolute value of the difference and the absolute value of the first average value is determined as the activity degree of the any neuron in the previous round of training. For example, the activity degree AR of the any neuron in the previous round of training is obtained by using the following formula:

$$AR = \frac{|AE - AC|}{|AC|}, \text{ or } AR = \frac{|AE - AC|}{|AC| + x}$$

In addition to the foregoing manner of obtaining the activity degree of the any neuron in the previous round of training, a variation may be further performed in the foregoing manner, to obtain another optional manner of obtaining the activity degree. x is a minimum value that prevents a quotient from being zero, for example, may be 0.0001. A value of x is not limited in this embodiment of this application.

For example, the first average value of the parameters obtained before the previous round of training of the any neuron is AC, and the second average value of the parameters obtained after the previous round of training of the any neuron is AE. The activity degree AR of the any neuron in the previous round of training is obtained by using the following formula:

$$AR = \frac{|AE - AC|}{|AC|} * \mu, \text{ or } AR = \frac{|AE - AC|}{|AC| + x} * \mu$$

In the formula, μ is an activity degree coefficient, and may be set based on experience or may be adjusted based on a status of each round of training.

For another example, the first average value of the parameters obtained before the previous round of training of the any neuron is AC, and the second average value of the parameters obtained after the previous round of training of the any neuron is AE. The activity degree AR of the any neuron in the previous round of training is obtained by using the following formula:

$$AR = \frac{|AE - AC|}{|AC|} + \varphi, \text{ or } AR = \frac{|AE - AC|}{|AC| + x} + \varphi$$

In the formula, φ is an activity degree constant, and may be set based on experience or may be adjusted based on a status of each round of training.

Regardless of which manner is used to obtain the activity degree of the any neuron, the obtained activity degree may be compared with the activity degree threshold. If the activity degree is greater than the activity degree threshold, the any neuron is used as the target neuron participating in the current round of training. The activity degree threshold is not limited in this embodiment of this application, and may be set based on experience or may be adjusted based on a status of each round of training.

Manner 2: The target neuron participating in the current round of training is determined in the plurality of neurons by querying a frozen-active flag bit.

A difference between Manner 2 and Manner 1 in which an activity degree of a neuron is calculated during each round of training, and a target neuron is determined based on whether the activity degree meets a threshold lies in that in the method provided in this embodiment of this application, the activity degree may not be calculated during the current round of training, but is implemented by querying the frozen-active flag bit. In an example embodiment, each neuron of the plurality of neurons has a corresponding frozen-active flag bit, and when a value of the frozen-active flag bit is a first value, the frozen-active flag bit indicates that the neuron participates in the current round of training. For example, after each round of training ends, the activity degree may be calculated in any one of the foregoing manners, and a value of a frozen-active flag bit of a neuron whose activity degree meets the threshold is set to the first value. In this case, the determining, from the plurality of neurons, a target neuron participating in the current round of training includes: determining a neuron whose value of frozen-active flag bit is the first value as the target neuron participating in the current round of training.

In the foregoing manner of indicating, by using the frozen-active flag bit, whether to participate in the current round of training, although the value of the frozen-active flag bit also needs to be determined by using the activity degree, because the value is obtained through calculation after the previous round of training ends, namely, obtained before the current round of training, the target neuron can be directly determined by using the frozen-active flag bit during the current round of training, so that a speed of determining the target neuron participating in the current round of training is relatively high. This further reduces training time and increases a training speed.

Further, how the value of the frozen-active flag bit of the neuron is determined during the current round of training is not limited in this embodiment of this application. In an example embodiment, each neuron of the plurality of neurons further has a corresponding frozen period, and the frozen period indicates a period in which the neuron does not participate in training. A value of a frozen-active flag bit corresponding to any neuron is determined based on a frozen period corresponding to the any neuron. For example, if a frozen period of any neuron ends, a frozen-active flag bit of the any neuron is the first value. In this way, a detection mechanism is provided by setting a frozen period, to indicate, based on the frozen period, the period in which the neuron does not participate in training, determine, based on the frozen period, whether the neuron participates in training, and determine a value of a frozen-active flag bit, thereby preventing loss of a parameter corresponding to a neuron that needs to participate in training in a training process, and ensuring robustness.

In this embodiment of this application, before the determining the neuron whose value of frozen-active flag bit is the first value as the target neuron participating in the current round of training, the method further includes: for any one of the plurality of neurons, obtaining the activity degree of the any neuron in the previous round of training, where the activity degree indicates a degree to which the neuron is affected by the local data; and updating the frozen period of the any neuron based on the activity degree of the any neuron in the previous round of training, and updating the value of the frozen-active flag bit of the any neuron based on an updated frozen period of the any neuron.

For the manner of obtaining the activity degree of the any neuron in the previous round of training, refer to the description of the activity degree calculation manner in Manner 1. Details are not described herein again. For example, the updating the frozen period of the any neuron based on the activity degree of the any neuron in the previous round of training includes but is not limited to updating the frozen period by using the following formula:

$$Ti' = \begin{cases} Ti+1 & ARi < X1 \\ Ti & X1 \le ARi \le X2 \\ \lfloor (Ti+1)/2 \rfloor & ARi \ge X2 \end{cases}$$

In the foregoing formula for updating the frozen period, Ti' indicates a frozen period after an $i^{th}$ neuron is updated, Ti indicates a frozen period before the $i^{th}$ neuron is updated, ARi indicates an activity degree of the $i^{th}$ neuron in a previous round of training, i is an integer ranging from 1 to N, and N is a total quantity of neurons. X1 indicates a first activity degree threshold, X2 indicates a second activity degree threshold, and X2 is greater than X1. [(Ti+1)/2] indicates that (Ti+1)/2 is rounded down.

Sizes of the first activity degree threshold and the second activity degree threshold are not limited in this embodiment of this application, and may be set based on experience or may be adjusted based on a training status. For example, if X1=0.2 and X2=0.4, the foregoing formula for updating the frozen period is:

$$Ti' = \begin{cases} Ti+1 & ARi < 0.2 \\ Ti & 0.2 \le ARi \le 0.4 \\ \lfloor (Ti+1)/2 \rfloor & ARi \ge 0.4 \end{cases}$$

For example, if an activity degree of any neuron is 0.3, a value of the frozen period Ti' after the update of the neuron is the same as a value of the frozen period Ti before the update. It may be considered that the activity degree of the neuron does not change greatly, and therefore, an original frozen period may be maintained. For example, if an active degree of any neuron is 0.1, the frozen period Ti' after the update of the neuron is equal to Ti+1. It may be considered that the neuron is not active enough, and therefore, the frozen period is increased. For example, if an active degree of any neuron is 0.6, the frozen period Ti' after the update of the neuron is equal to [(Ti+1)/2]. It may be considered that the neuron is relatively active, and therefore, the frozen period is reduced, so that the neuron participates in training as soon as possible, to ensure that no important information is lost.

In an example embodiment, the updating the value of the frozen-active flag bit of the any neuron based on an updated frozen period of the any neuron includes but is not limited to: for a neuron whose Ti'>Y, setting Fi' to a second value, for example, setting the second value to 1, which indicates that the current round of training can be frozen, that is, the neuron does not participate in the current round of training; and for a neuron whose Ti'=Y, setting Fi' to a first value, for example, setting the first value to 0, which indicates that the current round of training is not frozen, that is, the neuron participates in the current round of training. For example, Y may be 1.

In an example embodiment, after a round of training ends, the foregoing update process may not be performed on a frozen period of each neuron, but only a neuron whose frozen period ends is updated. Each of the plurality of neurons further has a corresponding frozen period counter, and the frozen period counter indicates whether the frozen period ends. The obtaining the activity degree of the any neuron in the previous round of training includes: in response to the fact that a value of a frozen period counter of the any neuron indicates that a frozen period of the any neuron ends, obtaining the activity degree of the any neuron in the previous round of training.

In this implementation, the frozen period counter is set, and indicates whether the frozen period ends, and the activity degree is obtained after the frozen period ends. This further reduces time for detecting whether the frozen period ends, and increases a training speed. For example, a lower activity degree indicates a larger value of a frozen period and a longer frozen period. An initial value of the frozen period counter may be set to 1. Each time a quantity of training rounds increases by one, a value of the frozen period counter increases by 1. In other words, the value of the frozen period is positively correlated with a value of the frozen period counter. When the value of the frozen period counter is equal to the value of the frozen period, it may be considered that the frozen period ends. In addition, the value of the frozen period counter may alternatively be negatively correlated with the value of the frozen period. For example, a lower activity degree indicates a larger value of a frozen period and a longer frozen period. An initial value of the frozen period counter may be set to the value of the frozen period. Each time a quantity of training rounds increases by one, the value of the frozen period counter decreases by 1. When the value of the frozen period counter is 0, it may be considered that the frozen period ends.

It should be noted that, when the current round of training is the first round of training, because an activity degree of a neuron in a previous round of training cannot be determined based on a result of the previous round of training, a value of a frozen-active flag bit of the neuron in the current round of training cannot be determined based on the activity degree of the neuron in the previous round of training. Therefore, this embodiment of this application provides an initialization process during the first round of training. For example, in response to the fact that the current round of training is the first round of training, a value of a frozen-active flag bit of each neuron in the plurality of neurons is set to the first value.

In other words, when the current round of training is the first round of training, a value of a frozen-active flag bit of each neuron is set to the first value. In this case, each neuron may be determined as a target neuron, to participate in the current round of training. Then, the value of the frozen-active flag bit of the neuron may be updated based on a result of the current round of training, so that during next round of training, the target neuron can be directly determined based on the value of the frozen-active flag bit that is updated in the current round of training. For a manner of updating the value of the frozen-active flag bit of the neuron, refer to the foregoing related descriptions. Details are not described herein again.

305: The client trains the target neuron based on the local data.

In the method provided in this embodiment of this application, the client may train the target neuron based on the local data, which may be performed based on a batch of the current round of training. For example, if the current round of training includes E batches, after performing one batch of the current round of training on the target neuron, the client obtains an updated AI model, and then continues to perform training until the E batches of the current round of training are completed.

A quantity of batches of the current round of training may be sent by the service end, or may be agreed in advance. A manner of obtaining the quantity of batches of the current round of training and the quantity of batches are not limited in this embodiment of this application.

306: The client returns parameter data corresponding to the target neuron to the service end.

A manner in which the client returns the parameter data corresponding to the target neuron to the service end is not limited in this embodiment of this application. Only a parameter corresponding to the target neuron may be returned, or only a parameter difference corresponding to the target neuron may be returned, thereby reducing communication bandwidth between the client and the service end. In addition, because the AI model obtained after training includes the parameter corresponding to the target neuron, the method provided in this embodiment of this application also supports returning the AI model obtained after training, to return the parameter data corresponding to the target neuron in a manner of returning the AI model obtained after training. Alternatively, parameters or parameter differences corresponding to all neurons may be returned to the service end. A parameter difference corresponding to any neuron may be a difference between a parameter that corresponds to the any neuron and that is obtained in the current round of training and a parameter that corresponds to the any neuron and that is obtained in the previous round of training.

For a manner of indicating, by using a frozen-active flag bit, whether a neuron participates in the current round of training, in an example embodiment, that the client returns the parameter data corresponding to the target neuron to the service end further includes: sending a frozen-active flag bit of each neuron to the service end, or sending, to the service end, a frozen-active flag bit whose value changes. A manner of sending the frozen-active flag bit is not limited in this embodiment of this application. If the current round of training is the first round of training, the client may send the frozen-active flag bit of each neuron to the service end. For a neuron whose value of the frozen-active flag bit does not change subsequently, the client may no longer send the frozen-active flag bit of the neuron subsequently, which further reduces communication bandwidth. For example, the manner of sending the frozen-active flag bit is not limited in this embodiment of this application. For example, if there are five neurons, five bits of data may be used for indication, and one bit corresponds to a frozen-active flag bit of one neuron. For the target neuron, a first value of the frozen-active flag bit is 1, and the frozen-active flag bit returned by the client may be 10011. If values of the first bit, the fourth bit, and the fifth bit are 1, it indicates that the first neuron, the fourth neuron, and the fifth neuron are target neurons.

307: The service end receives the parameter data that corresponds to the target neuron and that is returned by each of the plurality of clients.

Parameter data that corresponds to the target neuron and that is returned by any client is obtained by the any client by training the target neuron in the first AI model, and a quantity of target neurons is less than a total quantity of the plurality of neurons.

It should be noted that although the service end may send a same first AI model to each of the plurality of clients, because the clients have different local data, and the different local data has different degrees of impact on the neurons, there may be a case in which target neurons that participate in the current round of training and that are determined by different clients may be inconsistent, and parameters obtained after the target neurons are trained by using the local data are also different. In other words, the parameter data that corresponds to the target neurons and that is received by the service end from the plurality of clients may be different.

For example, the network architecture shown in FIG. 2 is used as an example. If the first AI model includes four neurons: a neuron 1, a neuron 2, a neuron 3, and a neuron 4, after the client 1 receives the first AI model sent by the service end, and determines activity degrees of the four neurons based on local data of the client 1, the client 1 determines that the activity degree of the neuron 1 and the activity degree of the neuron 2 are greater than an activity degree threshold. In other words, target neurons determined by the client 1 are the neuron 1 and the neuron 2. In this case, parameter data returned to the service end is also parameter data of the neuron 1 and parameter data of the neuron 2. After the client 2 receives the first AI model sent by the service end, and determines activity degrees of the four neurons based on local data of the client 2, the client 2 determines that the activity degree of the neuron 1, the activity degree of the neuron 2, and the activity degree of the neuron 3 are greater than the activity degree threshold. In other words, target neurons determined by the client 2 are the neuron 1, the neuron 2, and the neuron 3. In this case, parameter data returned to the service end is also parameter data of the neuron 1, parameter data of the neuron 2, and parameter data of the neuron 3.

It can be learned that a quantity of the target neurons determined by the client 1 is different from a quantity of the target neurons determined by the client 2. In addition, even if both the client 1 and the client 2 determine the neuron 1 and the neuron 2 as the target neurons, because the local data of the client 1 and the local data of the client 2 are different, for the same target neuron 1 and the neuron 2, the parameter data obtained by the client 1 by training the two neurons may also be different from the parameter data obtained by the client 2 by training the two neurons.

308: The service end restores, based on the parameter data that corresponds to the target neuron and that is returned by each client, a second AI model corresponding to each client, and obtains a converged target AI model based on the second AI model corresponding to each client.

As described above, because the local data of the clients may be different, the parameter data that corresponds to the target neurons and that is returned by the clients to the service end may also be different. Therefore, the service end restores, based on the parameter data that corresponds to the target neuron and that is returned by each client, the second AI model corresponding to each client.

In an example embodiment, that the service end restores, based on the parameter data that corresponds to the target neuron and that is returned by each client, the second AI model corresponding to each client includes: for any client, updating, based on parameter data that corresponds to a target neuron and that is returned by the any client, a parameter corresponding to the target neuron in the first AI model, to obtain a second AI model corresponding to the any client. For example, a non-target neuron in the second AI model is a parameter corresponding to a non-target neuron in the first AI model.

For example, the first AI model includes a neuron 1 and a neuron 2. The client 2 returns a parameter of the neuron 1, and does not return a parameter of the neuron 2. In this case, the neuron 1 is the target neuron, and the neuron 2 is the non-target neuron. A parameter corresponding to the neuron 1 in the first AI model is updated based on the parameter that corresponds to the neuron 1 and that is returned by the client, and a parameter corresponding to the neuron 2 in the first AI model is supplemented, to obtain a second AI model corresponding to the client 2.

For another example, the first AI model includes a neuron 1 and a neuron 2. The client 1 returns a parameter corresponding to the neuron 2, and does not return a parameter corresponding to the neuron 1. In this case, the neuron 2 is the target neuron, and the neuron 1 is the non-target neuron. A parameter corresponding to the neuron 2 in the first AI model is updated based on the parameter that corresponds to the neuron 2 and that is returned by the client, and a parameter corresponding to the neuron 1 in the first AI model is supplemented, to obtain a second AI model corresponding to the client 1.

A manner of supplementing a parameter corresponding to a non-target neuron is not limited in this embodiment of this application. For example, a parameter corresponding to a same non-target neuron in an AI model updated in a previous round of training may be used to replace a parameter corresponding to the non-target neuron in the first AI model.

It should be noted that, if the client returns the parameter difference corresponding to the target neuron, the value of the parameter corresponding to the target neuron in the first AI model and the parameter difference may be integrated to obtain the parameter corresponding to the target neuron.

When the second AI model corresponding to each client is obtained through restoration, to distinguish which neurons are target neurons, before the restoring the second AI model corresponding to each client based on the parameter that corresponds to the target neuron and that is returned by each client, the method provided in this embodiment of this application further includes: receiving a frozen-active flag bit of each neuron or a frozen-active flag bit whose value changes, that is returned by the plurality of clients; and determining the target neuron in the plurality of neurons by using the frozen-active flag bit of each neuron or the frozen-active flag bit whose value changes.

In an example embodiment, the obtaining the converged target AI model based on the second AI model corresponding to each client includes: performing federated averaging on the second AI model corresponding to each client, to obtain a third AI model; and in response to the fact that the third AI model is converged, using the third AI model as the target AI model; or in response to the fact that the third AI model is not converged, sending the third AI model to the plurality of clients, continuing to obtain a new AI model in a manner of obtaining the third AI model, and repeating this process until a converged target AI model is obtained.

For example, a manner of performing federated averaging on the second AI model corresponding to each client to obtain the third AI model is not limited in this embodiment of this application. Because one neuron may have one or more parameters, a same parameter corresponding to a same neuron in each second AI model may be averaged, and the average value is used as a parameter value of the same parameter corresponding to the same neuron in the third AI model. For example, for a same neuron in the second AI model corresponding to each client, an average value of parameters corresponding to the same neuron may be used as a target parameter value, and a parameter value corresponding to the neuron in the first AI model is replaced with the target parameter value, to obtain the third AI model. For example, the first AI model includes a neuron 1 and a neuron 2. A second AI model corresponding to any client is obtained through restoration based on the first AI model. Therefore, the second AI model also includes the neuron 1 and the neuron 2. Values of first parameters corresponding to the neurons 1 in all the second AI models are averaged, and then replace a value of the first parameter corresponding to the neuron 1 in the first AI model. Values of second parameters corresponding to the neurons 2 in all the second AI models are averaged, and then replace a value of the second parameter corresponding to the neuron 2 in the first AI model, to obtain a third AI model.

In addition to the foregoing restoration manner, a new restoration manner may be obtained through further variation. For example, for a same neuron in the second AI model corresponding to each client, an average value of parameters corresponding to the same neuron may be used, a product of the average value and a reference coefficient is used as a target parameter value, and a parameter value corresponding to the neuron in the first AI model is replaced with the target parameter value, to obtain a third AI model. That both the first AI model and the second AI model include a neuron 1 and a neuron 2 is still used as an example. Values of first parameters corresponding to the neurons 1 in all the second AI models are averaged to obtain a first average value, a product of the first average value and a reference coefficient is used to replace a value of the first parameter corresponding to the neuron 1 in the first AI model, values of second parameters corresponding to the neurons 2 in all the second AI models are averaged to obtain a second average value, and a product of the second average value and the reference coefficient is used to replace a value of the second parameter corresponding to the neuron 2 in the first AI model, to obtain a third AI model. The reference coefficient may be set based on experience, or may be adjusted based on an application scenario. This is not limited in this embodiment of this application.

Regardless of which manner is used to perform federated averaging to obtain the third AI model, after the third AI model is obtained, it is determined whether the third AI model is converged, and in response to the fact that the third AI model is converged, the third AI model is used as the target AI model. Alternatively, in response to the fact that the third AI model is not converged, the third AI model is sent to the plurality of clients, a new AI model continues to be obtained in a manner of obtaining the third AI model, and this process is repeated until a converged target AI model is obtained.

A manner of determining whether the third AI model is converged is not limited in this embodiment of this application, and may be that a quantity of rounds of training reaches a training threshold, or that performance of the third AI model meets a specific requirement.

In conclusion, according to the method provided in this embodiment of this application, not all neurons in the model need to be trained, but some neurons are selected for training based on an active condition. This can reduce power consumption, and increase a training speed. In addition, because the client transmits only a parameter corresponding to a trained neuron to the service end, communication bandwidth can be reduced.

In addition, a frozen-active flag bit indicates the active condition, so that a target neuron can be directly determined by using the frozen-active flag bit. Therefore, a speed of determining the target neuron is relatively high. This further reduces training time and increases a training speed. A frozen period is set, a period in which a neuron does not participate in training is indicated based on the frozen period, and whether the neuron participates in training is determined based on the frozen period, thereby preventing loss of a parameter corresponding to a neuron that needs to participate in training in a training process, and ensuring robustness. A frozen period counter is set, and indicates whether the frozen period ends, and the activity degree is obtained after the frozen period ends. This further reduces time for detecting whether the frozen period ends, and increases a training speed.

Figure 4:
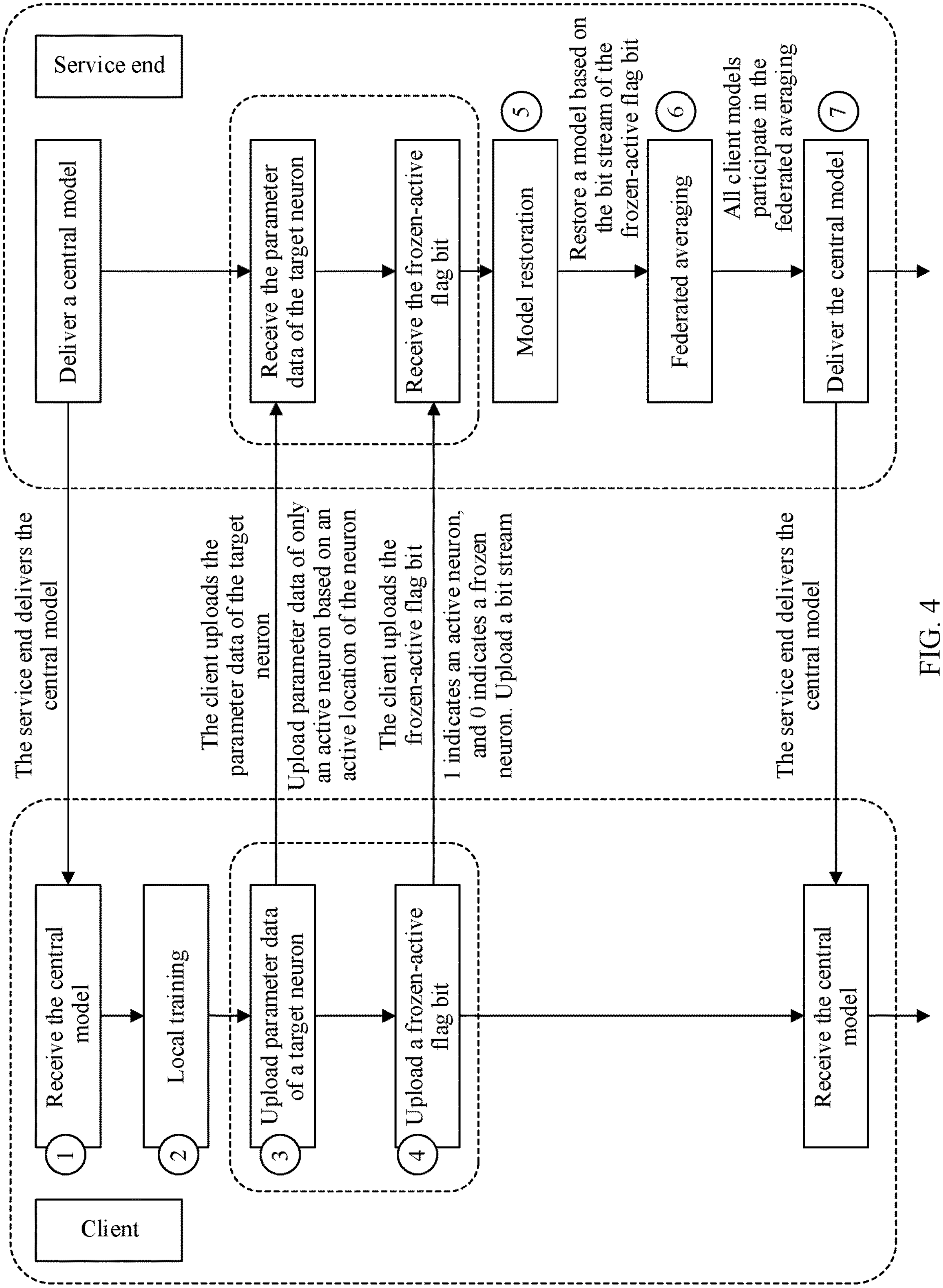
FIG. 4 is a schematic diagram of an interaction process of obtaining an artificial intelligence model according to an embodiment of this application.

An overall procedure of the method for obtaining an artificial intelligence model provided in this embodiment of this application may be an interaction process shown in FIG. 4. The following describes the method for obtaining an artificial intelligence model provided in this embodiment of this application by using an interaction process between a service end and a target client in a plurality of clients as an example. As shown in FIG. 4, the method includes but is not limited to the following steps.

401: The service end delivers a central model to the plurality of clients, and the target client receives the central model, where the central model has N neurons.

402: The client starts local training. If the current round is a first round, initialization is performed on a frozen period Ti=1, and i∈{1, 2, . . . , N}, indicating that freeze detection is performed on the $i^{th}$ neuron in the current round. Initialization is performed on a frozen-active flag bit Fi=0, and i ∈{1, 2, . . . , N}, indicating that the $i^{th}$ neuron is not frozen (if the value is 1, it indicates that the $i^{th}$ neuron is frozen). Initialization is performed on a frozen period counter Tci=1, and i ∈{1, 2, . . . , N} (Tci+1 for each interaction with the service end). The current count of training based on a neuron freezing method is locally performed, to update the values Ti, Fi, and Tci.

403: Each client uploads, to the service end, parameter data of a target neuron that participates in the current round of training.

404: If the frozen-active flag bit Fi changes, the target client uploads the frozen-active flag bit Fi to the service end.

It should be noted that, for a neuron whose frozen-active flag bit Fi does not change, the frozen-active flag bit Fi of the neuron may not be transmitted. If the frozen-active flag bits Fi of all neurons do not change, the process of 403 may be omitted.

405: The service end aggregates a local partial model of each client and the frozen-active flag bit, and restores each local model.

The service end aggregates the local partial model MI of each client, where I indicates a quantity of the clients. For example, a local partial model of a client 1 is M10, a local partial model of a client 2 is M20, a local partial model of a client 3 is M30, and the like.

For example, neurons are arranged from left to right and from top to bottom, and related parameters of the neurons are arranged from top to bottom. A neuron with a frozen-active flag bit Fi=1 is supplemented by using a nearest central model parameter, and a neuron with a frozen-active flag bit Fi=0 is updated by using a local partial model parameter.

406: The service end performs federated averaging on the local models, and updates the central model.

407: The service end delivers the central model to each client, and then 401 is performed.

The foregoing process of 401 to 407 is repeated until the central model is converged to obtain a converged target AI model. In this case, the federated learning training ends.

Figure 5:
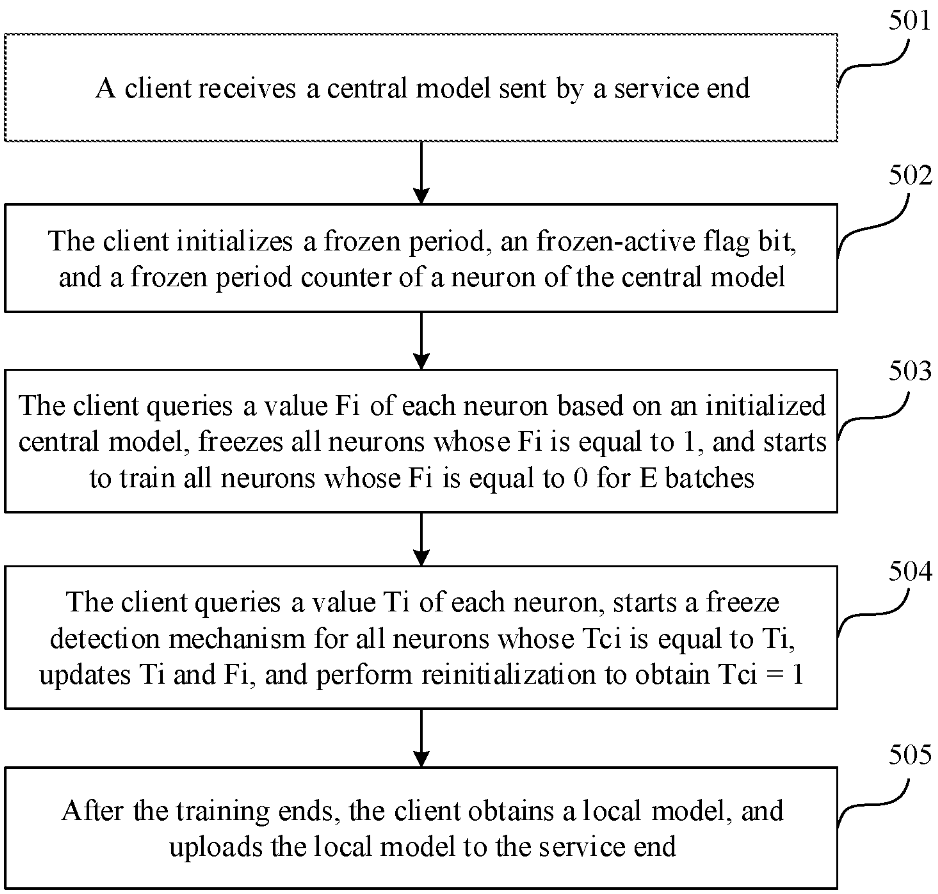
FIG. 5 is a schematic diagram of a process of obtaining an artificial intelligence model on a client according to an embodiment of this application.

A client performs the method for obtaining an artificial intelligence model. A model training process performed by the client is described by using an example shown in FIG. 5. As shown in FIG. 5, the method includes but is not limited to the following steps.

501: The client receives a central model sent by a service end.

The central model is usually a known model trained offline, and a quantity of neurons is N. In addition, the client determines batches E of the current round of training. A batch of each round of training may be delivered by the service end to the client, or may be agreed by both parties. Usually, a quantity of batches of each round of training on each client is the same.

502: The client initializes a frozen period, a frozen-active flag bit, and a frozen period counter of a neuron of the central model.

For example, the initialized frozen periods of neurons of the central model are all 1, namely, Ti=1, i ∈{1, 2, . . . , 5}. If Ti=1, the $i^{th}$ neuron of a local model in the current round of training needs to perform a freeze detection mechanism to update the frozen period.

The initialized frozen-active flag bit of each neuron is 0, namely, Fi=0, i ∈{1, 2, . . . , 5}. If Fi=1, the $i^{th}$ neuron of the local model in the current round of training is frozen, that is, a parameter corresponding to the neuron does not participate in training.

The initialized frozen period counter of each neuron is Tci=1.

503: The client queries a value Fi of each neuron based on the initial central model, freezes all neurons whose Fi is 1, and starts to train all neurons whose Fi is 0 for the batches E.

504: The client queries a value Ti of each neuron, starts a freeze detection mechanism for all neurons whose Tci is equal to Ti, updates Ti and Fi, and perform reinitialization to obtain Tci=1.

For all neurons whose Tci is not equal to Ti, Ti and Fi are maintained, and the counter Tci is updated to Tci+1 in the frozen period.

505: After the training ends, the client obtains a local model, and uploads the local model to the service end.

Figure 6:
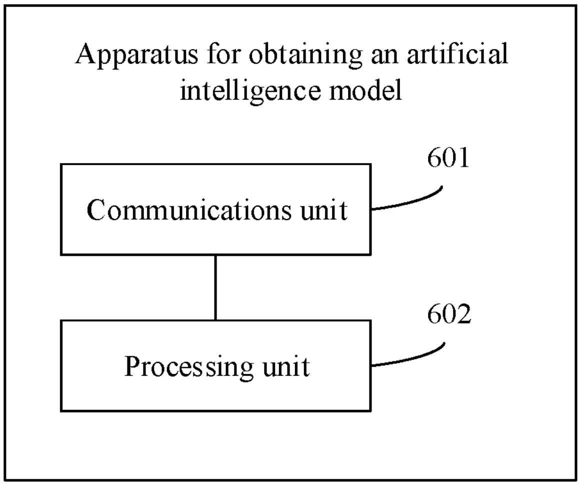
FIG. 6 is a schematic diagram of a structure of an apparatus for obtaining an artificial intelligence model according to an embodiment of this application.

An embodiment of this application provides an apparatus for obtaining an artificial intelligence model. The apparatus is configured to perform the method performed by the client in the embodiment shown in FIG. 3. As shown in FIG. 6, the apparatus includes:

a communications unit 601, configured to receive a first AI model sent by a service end, where the first AI model includes a plurality of neurons, for example, a function performed by the communications unit 601 may be shown in 303 in FIG. 3, and details are not described herein again; and a processing unit 602, configured to determine, from the plurality of neurons, a target neuron participating in a current round of training, where the current round of training is a non-first round of training, and a quantity of target neurons is less than a total quantity of the plurality of neurons; and for example, a function performed by the processing unit 602 may be shown in 303 in FIG. 3, and details are not described herein again.

The processing unit 602 is further configured to train the target neuron based on the local data, to obtain a parameter corresponding to the target neuron. For example, a function performed by the processing unit 602 may be shown in 305 in FIG. 3, and details are not described herein again.

The communications unit 601 is further configured to return parameter data corresponding to the target neuron to the service end. The parameter data corresponding to the target neuron is used by the service end to obtain a converged target AI model. For example, a function performed by the communications unit 601 may be shown in 306 in FIG. 3, and details are not described herein again.

In an example embodiment, each neuron in the plurality of neurons has a corresponding frozen-active flag bit, and when a value of the frozen-active flag bit is a first value, the frozen-active flag bit indicates that the neuron participates in the current round of training; and the processing unit 602 is configured to determine the neuron whose value of frozen-active flag bit is the first value as the target neuron participating in the current round of training.

In an example embodiment, each neuron in the plurality of neurons further has a corresponding frozen period, and the frozen period indicates a period in which the neuron does not participate in training; and a value of a frozen-active flag bit corresponding to any neuron is determined based on a frozen period corresponding to the any neuron.

In an example embodiment, the processing unit 602 is further configured to: for the any neuron in the plurality of neurons, obtain an activity degree of the any neuron in a previous round of training, where the activity degree indicates a degree to which the neuron is affected by the local data; and update the frozen period of the any neuron based on the activity degree of the any neuron in the previous round of training, and update the value of the frozen-active flag bit of the any neuron based on an updated frozen period of the any neuron.

In an example embodiment, each neuron in the plurality of neurons further has a corresponding frozen period counter, and the frozen period counter indicates whether the frozen period ends; and the processing unit 602 is configured to: in response to the fact that a value of a frozen period counter of the any neuron indicates that the frozen period of the any neuron ends, obtain the activity degree of the any neuron in the previous round of training.

In an example embodiment, the processing unit 602 is configured to: in response to the fact that the current round of training is the non-first round of training, for any neuron in the plurality of neurons, obtain an activity degree of the any neuron in a previous round of training, where the activity degree indicates a degree to which the neuron is affected by the local data; and in response to the fact that the activity degree of the any neuron in the previous round of training is greater than an activity degree threshold, determine the any neuron as the target neuron participating in the current round of training.

In an example embodiment, the processing unit 602 is configured to: obtain a first average value of parameters obtained before the previous round of training of the any neuron and a second average value of parameters obtained after the previous round of training of the any neuron; obtain a difference between the first average value and the second average value; and determine the activity degree of the any neuron in the previous round of training based on an absolute value of the difference and an absolute value of the first average value.

In an example embodiment, the processing unit 602 is further configured to: receive the first artificial intelligence AI model sent by the service end, determine all neurons in the plurality of neurons as target neurons, and train the target neurons based on the local data.

In an example embodiment, the communications unit 601 is further configured to send the frozen-active flag bit of each neuron to the service end, or send, to the service end, a frozen-active flag bit whose value changes.

In an example embodiment, the communications unit 601 is configured to return only the parameter data corresponding to the target neuron to the service end.

According to the apparatus provided in this embodiment of this application, not all neurons in the model need to be trained, but some neurons are selected for training based on an active condition. This can reduce power consumption, and increase a training speed. In addition, because the client transmits only a parameter corresponding to a trained neuron to the service end, communication bandwidth can be reduced.

In addition, a frozen-active flag bit indicates the active condition, so that a target neuron can be directly determined by using the frozen-active flag bit. Therefore, a speed of determining the target neuron is relatively high. This further reduces training time and increases the training speed. A frozen period is set, a period in which a neuron does not participate in training is indicated based on the frozen period, and whether the neuron participates in training is determined based on the frozen period, thereby preventing loss of a parameter corresponding to a neuron that needs to participate in training in a training process, and ensuring robustness. A frozen period counter is set, and indicates whether the frozen period ends, and the activity degree is obtained after the frozen period ends. This further reduces time for detecting whether the frozen period ends, and increases the training speed.

Figure 7:
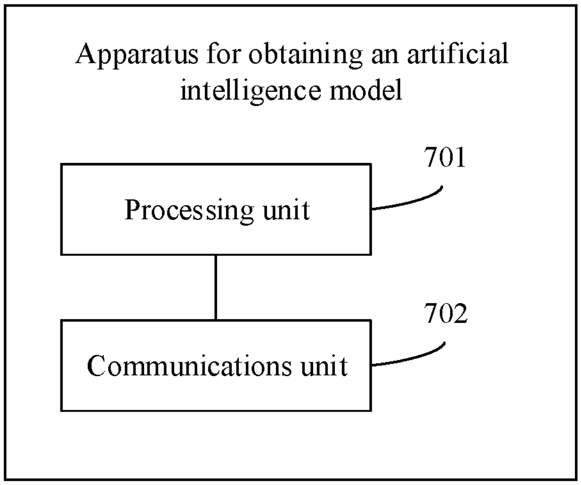
FIG. 7 is a schematic diagram of a structure of an apparatus for obtaining an artificial intelligence model according to an embodiment of this application.

An embodiment of this application provides an apparatus for obtaining an artificial intelligence model. The apparatus is configured to perform a function performed by the service end in the embodiment shown in FIG. 3. As shown in FIG. 7, the apparatus includes:

a processing unit 701, configured to obtain a to-be-trained first artificial intelligence AI model, where the first AI model includes a plurality of neurons, for example, a function performed by the processing unit 701 may be shown in 301 in FIG. 3, and details are not described herein again; and a communications unit 702, configured to send the first AI model to a plurality of clients, for example, a function performed by the communications unit 702 may be shown in 302 in FIG. 3, and details are not described herein again.

The communications unit 702 is further configured to receive parameter data that corresponds to a target neuron and that is returned by each client in the plurality of clients, where parameter data that corresponds to the target neuron and that is returned by any client is obtained by the any client by training the target neuron in the first AI model, and a quantity of target neurons is less than a total quantity of the plurality of neurons. For example, a function performed by the communications unit 702 may be shown in 307 in FIG. 3, and details are not described herein again.

The processing unit 701 is further configured to: restore, based on the parameter data that corresponds to the target neuron and that is returned by each client, a second AI model corresponding to each client, and obtain a converged target AI model based on the second AI model corresponding to each client. For example, a function performed by the processing unit 701 may be shown in 307 in FIG. 3, and details are not described herein again.

In an example embodiment, the processing unit 701 is configured to: for any client, update, based on a parameter that corresponds to the target neuron and that is returned by the any client, a parameter corresponding to the target neuron in the first AI model, and supplement a parameter corresponding to a non-target neuron in the first AI model, to obtain a second AI model corresponding to the any client.

In an example embodiment, the processing unit 701 is configured to: for any client, update, based on the parameter data that corresponds to the target neuron and that is returned by the any client, a parameter corresponding to the target neuron in the first AI model, and supplement a parameter corresponding to a non-target neuron in the first AI model, to obtain a second AI model corresponding to the any client.

In an example embodiment, the processing unit 701 is configured to: perform federated averaging on the second AI model corresponding to each client, to obtain a third AI model; and in response to the fact that the third AI model is converged, use the third AI model as the target AI model; or in response to the fact that the third AI model is not converged, send the third AI model to the plurality of clients, continue to obtain a new AI model in a manner of obtaining the third AI model, and repeat this process until the converged target AI model is obtained.

In an example embodiment, the communications unit 702 is further configured to receive a frozen-active flag bit of each neuron or a frozen-active flag bit whose value changes, that is returned by the plurality of clients.

The processing unit 701 is configured to determine the target neuron in the plurality of neurons by using the frozen-active flag bit of each neuron or the frozen-active flag bit whose value changes.

According to the apparatus provided in this embodiment of this application, the client does not train all neurons in the model, but selects some neurons for training based on an active condition, and uploads only a parameter corresponding to a trained target neuron. Therefore, communication bandwidth can be reduced, and a training speed can be increased. In this way, a speed of obtaining the target AI model is increased.

Furthermore, in addition to updating the parameter corresponding to the target neuron in the first AI model, a parameter corresponding to a non-target neuron in the first AI model is also supplemented. This ensures integrity of the model, so that performance of the obtained target AI model is better.

It should be understood that, when the apparatus provided in FIG. 6 or FIG. 7 implements functions of the apparatus, division into the functional modules is merely used as an example for description. During actual application, the foregoing functions may be allocated to different functional modules for implementation based on a requirement. In other words, an inner structure of a device is divided into different functional modules, to implement all or some of the functions described above. In addition, the apparatuses provided in the foregoing embodiments and the method embodiments pertain to a same concept. For a specific implementation process of the apparatuses, refer to the method embodiments. Details are not described herein again.

Figure 8:
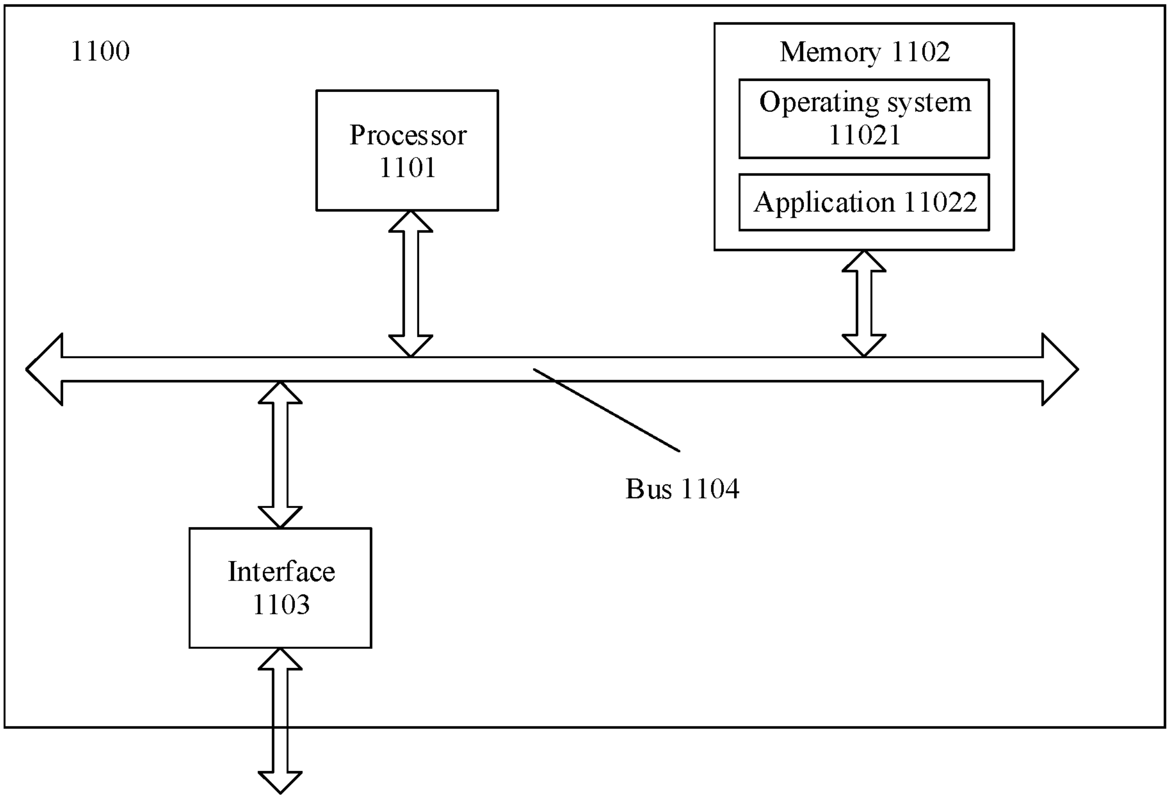
FIG. 8 is a schematic diagram of a structure of a device for obtaining an artificial intelligence model according to an embodiment of this application.

FIG. 8 is a schematic diagram of a hardware structure of a device 1100 for obtaining an artificial intelligence model according to an embodiment of this application. The device 1100 for obtaining an artificial intelligence model shown in FIG. 8 may perform corresponding steps performed by the service end or the client in the methods in the foregoing embodiments.

As shown in FIG. 8, the device 1100 for obtaining an artificial intelligence model includes a processor 1101, a memory 1102, an interface 1103, and a bus 1104. The interface 1103 may be implemented in a wireless or wired manner, and may be specifically a network adapter. The processor 1101, the memory 1102, and the interface 1103 are connected through the bus 1104.

The interface 1103 may include a transmitter and a receiver. The device for obtaining an artificial intelligence model may receive and send, through the interface 1103, a parameter corresponding to a target neuron.

For example, the device 1100 for obtaining an artificial intelligence model shown in FIG. 8 is the client in FIG. 3, and the processor 1101 reads instructions in the memory 1102, so that the device 1100 for obtaining an artificial intelligence model shown in FIG. 8 can perform all or some operations performed by the client.

For another example, the device 1100 for obtaining an artificial intelligence model shown in FIG. 8 is the service end in FIG. 3, and the processor 1101 reads instructions in the memory 1102, so that the device 1100 for obtaining an artificial intelligence model shown in FIG. 8 can perform all or some operations performed by the service end.

In addition, the processor 1101 is configured to perform another process of the technology described in this specification. The memory 1102 includes an operating system 11021 and an application 11022, and is configured to store a program, code, or instructions. When executing the program, the code, or the instructions, the processor or a hardware device may complete a processing process related to the device 1100 for obtaining an artificial intelligence model in the method embodiment. Optionally, the memory 1102 may include a read-only memory (ROM) and a random access memory (RAM). The ROM includes a basic input/output system (BIOS) or an embedded system. The RAM includes an application program and an operating system. When the device 1100 for obtaining an artificial intelligence model needs to be run, a system is booted by using a BIOS fixed in a ROM or a bootloader in an embedded system, and the device 1100 for obtaining an artificial intelligence model is booted into a normal running state. After entering the normal running state, the device 1100 for obtaining an artificial intelligence model runs the application and the operating system in the RAM, to complete a processing process related to the device 1100 for obtaining an artificial intelligence model in the method embodiments.

It may be understood that FIG. 8 shows only a simplified design of the device 1100 for obtaining an artificial intelligence model. During actual application, the device 1100 for obtaining an artificial intelligence model may include any quantity of interfaces, processors, or memories.

It should be understood that the processor may be a central processing unit (CPU), or may be another general-purpose processor, a digital signal processor (DSP), an application-specific integrated circuit (ASIC), a field-programmable gate array (FPGA) or another programmable logic device, a discrete gate or a transistor logic device, a discrete hardware component, or the like. The general-purpose processor may be a microprocessor, any conventional processor, or the like. It should be noted that the processor may be a processor that supports an advanced reduced instruction set computer machines (ARM) architecture.

Further, in an optional embodiment, the memory may include a read-only memory and a random access memory, and provide instructions and data for the processor. The memory may further include a nonvolatile random access memory. For example, the memory may further store information of a device type.

The memory may be a volatile memory or a nonvolatile memory, or may include both a volatile memory and a nonvolatile memory. The nonvolatile memory may be a ROM, a programmable read-only memory (PROM), an erasable programmable read-only memory (EPROM), an electrically erasable programmable read-only memory (EEPROM), or a flash memory. The volatile memory may be a random access memory (RAM), used as an external cache. By way of example but not limitation, many forms of RAMs may be used, for example, a static random access memory (SRAM), a dynamic random access memory (DRAM), a synchronous dynamic random access memory (SDRAM), a double data rate synchronous dynamic random access memory (DDR SDRAM), an enhanced synchronous dynamic random access memory (ESDRAM), a synchlink dynamic random access memory (SLDRAM), and a direct rambus random access memory (DR RAM).

A computer-readable storage medium is further provided. The storage medium stores at least one instruction, and the instruction is loaded and executed by a processor to implement any one of the foregoing methods for obtaining an artificial intelligence model.

This application provides a computer program. When the computer program is executed by a computer, a processor or the computer is enabled to perform corresponding steps and/or procedures in the foregoing method embodiments.

A chip is provided. The chip includes a processor, configured to: invoke, from a memory, instructions stored in the memory and run the instructions, so that a communications device on which the chip is installed performs the methods in the foregoing aspects.

Another chip is provided. The chip includes an input interface, an output interface, a processor, and a memory. The input interface, the output interface, the processor, and the memory are connected to each other through an internal connection channel. The processor is configured to execute code in the memory. When the code is executed, the processor is configured to perform the methods in the foregoing aspects.

All or some of the foregoing embodiments may be implemented by using software, hardware, firmware, or any combination thereof. When the software is used to implement the embodiments, all or some of the embodiments may be implemented in a form of a computer program product. The computer program product includes one or more computer instructions. When the computer program instructions are loaded and executed on a computer, the procedure or functions according to this application are all or partially generated. The computer may be a general-purpose computer, a dedicated computer, a computer network, or another programmable apparatus. The computer instructions may be stored in the computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line) or wireless (for example, infrared, radio, or microwave) manner. The computer-readable storage medium may be any usable medium accessible by the computer, or a data storage device, such as a server or a data center, integrating one or more usable media. The usable medium may be a magnetic medium (for example, a floppy disk, a hard disk, or a magnetic tape), an optical medium (for example, a DVD), or a semiconductor medium (for example, a solid state disk).

In the foregoing specific implementations, the objectives, technical solutions, and beneficial effects of this application are further described in detail. It should be understood that the foregoing descriptions are merely specific implementations of this application, but are not intended to limit the protection scope of this application. Any modification, equivalent replacement, improvement, or the like made based on the technical solutions of this application shall fall within the protection scope of this application.

What is claimed is:

1. A method for a client device obtaining an artificial intelligence (AI) model, wherein the method comprises:

receiving, sent by a service end device, a first AI model comprising a plurality of neurons, wherein each neuron in the plurality of neurons is associated with a frozen-active flag bit whose current value determines whether the neuron is a target neuron, wherein the current value of the frozen-active flag bit is based on a previous round of training, and wherein at least one target neuron is selected from the plurality of neurons;

determining, from the plurality of neurons, the at least one target neuron for participating in training at the client device based on the current value of the frozen-active flag bit associated with each of the at least one target neuron;

locally training only the at least one target neuron based on data local to the client device; and returning parameter data associated with only the at least one target neuron to the service end device for use in obtaining a converged target AI model at the service end device, wherein the client device is among a plurality of client devices connected to the service end device, and wherein the converged target AI model is based on parameter data from each client device in the plurality of client devices.

2. The method according to claim 1, wherein determining, from the plurality of neurons, the at least one target neuron participating in the local training comprises determining each neuron whose current value of frozen-active flag bit is a first value.

3. The method according to claim 2, wherein returning the parameter data associated with the at least one target neuron to the service end device further comprises sending, to the service end device, a frozen-active flag bit whose value changes.

4. The method according to claim 2, wherein each neuron in the plurality of neurons has an associated frozen period that indicates a period in which the neuron does not participate in the local training; and a value of the frozen-active flag bit associated with each neuron in the plurality of neurons is determined based on a frozen period associated with the neuron.

5. The method according to claim 4, wherein before determining the at least one neuron whose current value of the frozen-active flag bit is the first value, the method further comprises:

for each neuron in the plurality of neurons, obtaining an activity degree of the neuron based on a previous round of training, wherein the activity degree indicates a degree to which the neuron is affected by the local data; and updating the frozen period of each neuron based on the activity degree of the neuron, and updating the current value of the frozen-active flag bit of the neuron based on the updated frozen period.

6. The method according to claim 5, wherein each neuron in the plurality of neurons further is associated with a frozen period counter that indicates when the frozen period ends; and wherein obtaining the activity degree of each neuron is in response to a value of the frozen period counter of the neuron indicating the frozen period of the neuron ends.

7. The method according to claim 1, wherein determining, from the plurality of neurons, the at least one target neuron participating in the local training comprises:

for each neuron in the plurality of neurons, obtaining an activity degree of the respective neuron in a previous round of training, wherein the activity degree indicates a degree to which each neuron is affected by the local data; and in response to the activity degree of each neuron in the previous round of training being greater than an activity degree threshold, determining the neuron as among the at least one target neuron participating in the local training.

8. The method according to claim 7, wherein obtaining the activity degree of each neuron in the previous round of training comprises:

obtaining a first average value of parameters obtained before the previous round of training of the neuron and a second average value of parameters obtained after the previous round of training of the neuron;

obtaining a difference between the first average value and the second average value; and determining the activity degree of the neuron in the previous round of training based on an absolute value of the difference and an absolute value of the first average value.

9. The method according to claim 2, wherein returning the parameter data associated with the at least one target neuron to the service end device further comprises sending the frozen-active flag bit of each neuron to the service end device.

10. A method for obtaining an artificial intelligence (AI) model, wherein the method comprises:

obtaining, by a service end device, a to-be-trained first AI model comprising a plurality of neurons, wherein each neuron in the plurality of neurons is associated with a frozen-active flag bit whose current value determines whether the neuron is a target neuron, wherein the current value of the frozen-active flag bit is based on a previous round of training, wherein at least one target neuron comprises a subset of the plurality of neurons;

sending, by the service end device, the first AI model to a plurality of client devices, and wherein the subset of the plurality of neurons comprising the at least one target neuron is different for each of the client devices comprising the plurality of client devices;

receiving, by the service end device, parameter data from each of the plurality of client devices, wherein each of the parameter data is associated with the subset of the plurality of neurons comprising the at least one target neuron in the first AI model sent to the respective client device, wherein the parameter data from each client device represent local training of only the at least one target neuron comprising the subset of the plurality of neurons in the first AI model, and wherein local training is training at the respective client device;

restoring, by the service end device and based on the parameter data received from each client device, a second AI model based on the first AI model; and obtaining a converged target AI model based on all the second AI models associated with the plurality of client devices.

11. The method according to claim 10, wherein restoring the second AI model comprises:

for each client device, updating one or more parameters in the first AI model based on the received parameter data associated with the client device to obtain the second AI model associated with the client device.

12. The method according to claim 10, wherein before restoring the second AI model associated with each client device, the method further comprises:

receiving, from each of the plurality of client devices, the frozen-active flag bit of each neuron in the plurality of neurons sent to the client device or a frozen-active flag bit whose current value has changed; and determining the at least one target neuron in the plurality of neurons from each of the plurality of client devices based on the current value of the frozen-active flag bit of each neuron in the plurality of neurons or a change of the current value of the frozen-active flag bit of each neuron of the plurality of neurons.

13. A client device for obtaining an artificial intelligence (AI) model, the client device comprising:

at least one processor; and a memory coupled to the at least one processor and configured to store instructions that, when executed by the at least one processor, cause the device to:

receive from a service end device a first AI model comprising a plurality of neurons, wherein each neuron in the plurality of neurons is associated with a frozen-active flag bit whose current value determines whether the neuron is a target neuron, wherein the current value of the frozen-active flag bit is based on a previous round of training, and wherein at least one target neuron is selected from the plurality of neurons;

determine, from the plurality of neurons, the at least one target neuron for participating in training at the client device based on the current value of the frozen-active flag bit associated with each of the at least one target neuron;

locally train only the at least one target neuron based on data local to the client device; and return parameter data associated with the at least one target neuron to the service end device for use in obtaining a converged target AI model at the service end device, wherein the client device is among a plurality of client devices connected to the service end device, and wherein the converged target AI model is based on parameter data from each client device in the plurality of client devices.

14. The client device according to claim 13, wherein the at least one processor executes the instructions and the device is further caused to determine each neuron whose current value of frozen-active flag bit is a first value.

15. The client device according to claim 14, wherein each neuron in the plurality of neurons further has an associated frozen period that indicates a period in which the neuron does not participate in the local training; and the current value of the frozen-active flag bit associated with each neuron in the plurality of neurons is determined based on a frozen period associated with the neuron.

16. The client device according to claim 15, wherein the at least one processor executes the instructions and the client device is further caused to:

for each neuron in the plurality of neurons, obtain an activity degree of the respective neuron based on a previous round of training, wherein the activity degree indicates a degree to which the neuron is affected by the local data; and update the frozen period of each neuron based on the activity degree of the neuron, and update the current value of the frozen-active flag bit of the neuron based on the updated frozen period.

17. The client device according to claim 13, wherein the at least one processor executes the instructions and the client device is further caused to:

in response to the local training for each neuron in the plurality of neurons, obtain an activity degree of the neuron based on a previous round of training, wherein the activity degree indicates a degree to which the neuron is affected by the local data; and in response to the activity degree of the neuron being greater than an activity degree threshold, determine the neuron as the at least one target neuron.

18. The client device according to claim 16, wherein the at least one processor executes the instructions and the client device is further caused to:

obtain a first average value of parameters obtained before the previous round of training of the neuron and a second average value of parameters obtained after the previous round of training of the neuron;

obtain a difference between the first average value and the second average value; and determine the activity degree of the neuron in the previous round of training based on an absolute value of the difference and an absolute value of the first average value.

19. The client device according to claim 14, wherein the at least one processor executes the instructions and the device is further caused to send the frozen-active flag bit of each neuron to the service end device.

20. The client device according to claim 14, wherein the at least one processor executes the instructions and the device is further caused to send, to the service end device, a frozen-active flag bit whose value changes.

* * * * *